(12) United States Patent
Park

(10) Patent No.: US 7,781,344 B2
(45) Date of Patent: Aug. 24, 2010

(54) METHOD FOR MANUFACTURING A SEMICONDUCTOR DEVICE BY SELECTIVE ETCHING

(75) Inventor: Sa Ro Han Park, Gwangjin-gu (KR)

(73) Assignee: Hynix Semiconductor Inc., Icheon-si (KR)

( * ) Notice: Subject to any disclaimer, the term of this patent is extended or adjusted under 35 U.S.C. 154(b) by 326 days.

(21) Appl. No.: 11/771,416

(22) Filed: Jun. 29, 2007

(65) Prior Publication Data
US 2008/0090420 A1   Apr. 17, 2008

(30) Foreign Application Priority Data
Oct. 13, 2006   (KR)   .................. 10-2006-0099912

(51) Int. Cl.
*H01L 21/311* (2006.01)
(52) U.S. Cl. .............. 438/700; 257/E21.029; 257/E21.038
(58) Field of Classification Search .......... 438/700; 257/E21.029, E21.038
See application file for complete search history.

(56) References Cited
U.S. PATENT DOCUMENTS
2006/0079093 A1*   4/2006   Kim et al. ............... 438/706

2007/0004140 A1*   1/2007   Jang et al. ............... 438/257

FOREIGN PATENT DOCUMENTS
KR   10-2000-0027926   5/2000
KR   10-2003-0060198   7/2003

OTHER PUBLICATIONS

Korean Intellectual Property Office Notice of Rejection for Application No. 10-22006-0099912, dated Sep. 30, 2008.

* cited by examiner

*Primary Examiner*—W. David Coleman
*Assistant Examiner*—Sonya D McCall-Shepard
(74) *Attorney, Agent, or Firm*—Marshall, Gerstein & Borun LLP

(57) ABSTRACT

A method of manufacturing a semiconductor device according to the invention is an effective technique for ensuring a sufficient process margin and enabling the formation of a fine pattern in a peripheral circuit region. The method includes forming an anti-reflective layer with a varying thickness in a peripheral circuit region and a cell region, and then over-etching the anti-reflective layer in the peripheral circuit region. The method is capable of improving the data processing speed of a semiconductor device and therefore increases the device efficiency.

11 Claims, 5 Drawing Sheets

METHOD FOR MANUFACTURING A SEMICONDUCTOR DEVICE BY SELECTIVE ETCHING

CROSS-REFERENCE TO RELATED APPLICATION

The priority of Korean patent application number 10-2006-0099912, filed on Oct. 13, 2006, the entire disclosure of which is incorporated herein by reference, is claimed.

BACKGROUND OF THE INVENTION

The invention relates generally to a semiconductor device and a method for manufacturing a semiconductor device. More specifically, the invention relates to a technique that is effective for ensuring a sufficient process margin to enable the formation of a fine pattern in a peripheral circuit region. The invention includes forming an anti-reflective layer with a varying thickness in a peripheral circuit region as compared to a cell region, and then over-etching the anti-reflective layer in the peripheral circuit region. The invention is capable of improving the data processing speed of a semiconductor device to thereby increase the device efficiency.

With trends in size reduction according to the decreasing design rule of DRAM processes, transistors formed in a peripheral circuit region also should be reduced in size. In reality, however, an isolation pattern in the peripheral circuit region has a short process margin, compared with a dense pattern in a cell region, so it is difficult to form a fine pattern in the peripheral circuit region.

This difficulty arises during a pattern formation process in which a broad area of the isolation pattern in the peripheral circuit region is etched. This causes the etch loading effect to occur, and by-products are deposited on the sides of etched semiconductor structures.

SUMMARY OF THE INVENTION

In view of the foregoing, the invention provides a method for manufacturing a semiconductor device that is effective for ensuring a sufficient process margin to enable the formation of a fine pattern in a peripheral circuit region The method includes forming an anti-reflective layer with a varying thickness in a peripheral circuit region and a cell region, and then over-etching the anti-reflective layer in the peripheral circuit region. The method is capable of improving the data processing speed of a semiconductor device and therefore increases the device efficiency.

A method for manufacturing a semiconductor device according to the invention includes the steps of: sequentially forming a hard mask layer and a first anti-reflective layer over an etching target layer, the etching target layer including a dense pattern region and an isolation pattern region; selectively etching the first anti-reflective layer to expose the hard mask layer in the isolation pattern region; forming a second anti-reflective layer of a preset thickness over the first anti-reflective layer and the hard mask layer in the isolation pattern region; and selectively etching the second anti-reflective layer, the first anti-reflective layer, and the hard mask layer, thereby forming a hard mask pattern and over-etching the second anti-reflective layer in the isolation pattern region.

Preferably the dense pattern region is a cell region, and the isolation pattern region is a peripheral circuit region. The first and second anti-reflective layers can include either organic anti-reflective layers or inorganic anti-reflective layers.

Preferably, the second anti-reflective layer has a thickness in a range of 20 Å to 500 Å.

Preferably, the step of selectively etching the second anti-reflective layers, the first anti-reflective layer, and the hard mask layer further includes the steps of: forming a photoresist over the second anti-reflective layer; exposing and developing the photoresist using an exposing mask having a light shielding pattern, thereby forming a photoresist pattern; selectively etching the first anti-reflective layer, the second anti-reflective layer, and the hard mask layer using the photoresist pattern as an etching mask; and removing the photoresist pattern, the first anti-reflective layer, and the second anti-reflective layer.

Preferably, the light shielding pattern has a first line width in the isolation pattern region and a second line width in the dense pattern region, and the first line width is greater than the second line width.

Preferably, the step of exposing and developing the photoresist includes using I-line, KrF, ArF, or ArF Immersion exposure.

Preferably, the hard mask pattern includes a line/space pattern, and a line width ratio between line and space is in a range of 1:15 to 1:100.

Other objectives and advantages of the invention will be understood by the following description and embodiments of the invention more clearly. Further, the objectives and advantages of the invention will readily be seen that they can be realized by the means and combinations specified in the claims.

DESCRIPTION OF SPECIFIC EMBODIMENTS

Hereinafter, the invention is described in detail with reference to the accompanying drawings so that those skilled in the art can easily carry out the invention.

Figure 1:
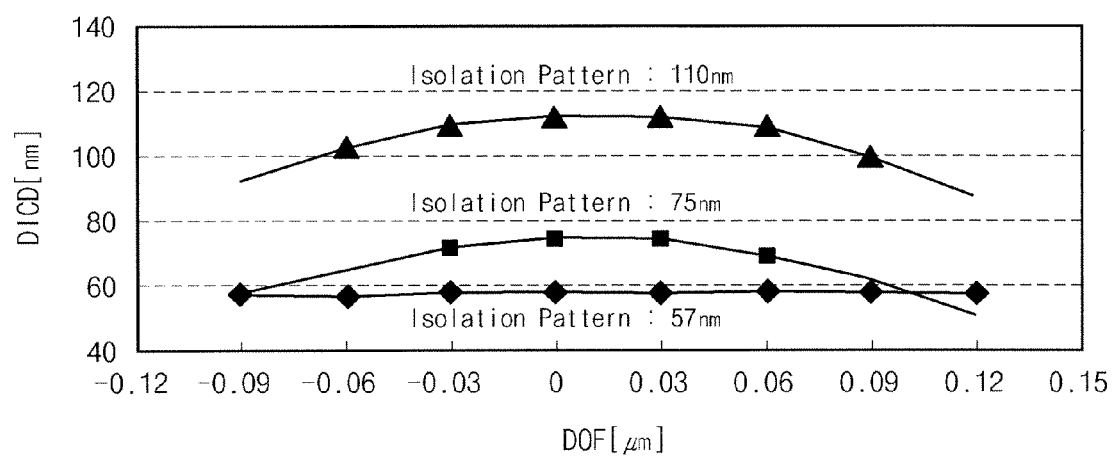
FIG. 1 is a graph showing the relation between develop inspection critical dimension (DICD) and depth of focus (DOF) of a dense line with a line width of 57 nm, an isolation line pattern with a line width of 75 nm, and an isolation line pattern with a line width of 110 nm, respectively.

FIG. 1 is a graph showing the relation between develop inspection critical dimension (DICD) and depth of focus (DOF) of a dense line with a line width of 57 nm, an isolation line pattern with a line width of 75 nm, and an isolation line pattern with a line width of 110 nm, respectively.

Referring to the graph, the isolation line pattern with a line width of 75 nm has a comparatively smaller DOF margin than that of the dense line pattern with a line width of 57 nm.

Meanwhile, the isolation line pattern with a line width of 110 nm, which is relatively larger than the dense line pattern with a line width of 57 nm, exhibits an improved DOF margin compared to the isolation line pattern with a line width of 75 nm.

As mentioned earlier, to ensure a DOF margin of an isolation pattern formed in a peripheral circuit region, forming a pattern with a comparatively large line width is more attainable than a fine pattern.

FIGS. 2a through 2h are cross-sectional views showing the steps of a manufacturing method a semiconductor device according to a preferred embodiment of the invention. A dense pattern is formed in a cell region, and an isolation pattern is formed in a peripheral circuit region.

Figure 2A:
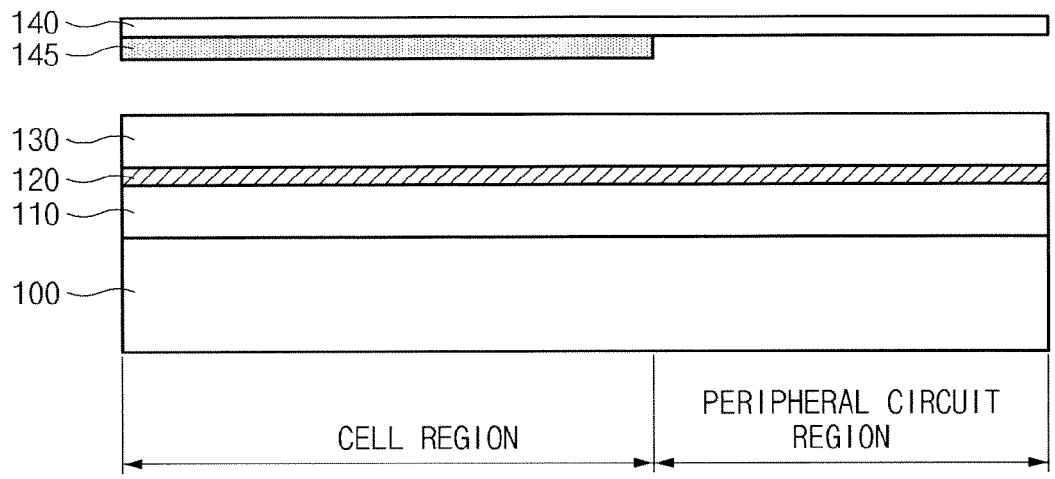
FIGS. 2a through 2h are cross-sectional views showing the steps of a method for manufacturing a semiconductor device according to a preferred embodiment of the invention.

Referring to FIG. 2a, a hard mask layer 110, a first anti-reflective layer 120, and a first photoresist 130 are sequentially formed on an upper part of an etching target layer 100 having a cell region and a peripheral circuit region.

Next, a portion corresponding to the cell region is exposed by a first exposing mask 140 having a first light shielding pattern 145. Here, the first anti-reflective layer 120 preferably includes an organic anti-reflective layer or an inorganic anti-reflective layer. The exposure process preferably is chosen from, but is not limited to, I-Line, KrF, ArF, and ArF immersion.

Figure 2B:
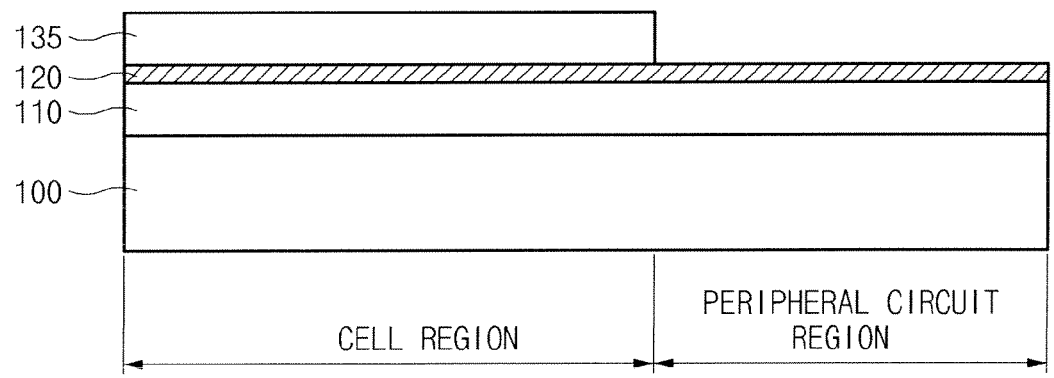

Referring to FIG. 2b, a development process is carried out to form a first photoresist pattern 135, exposing the first anti-reflective layer 120 in the peripheral circuit region.

Figure 2C:
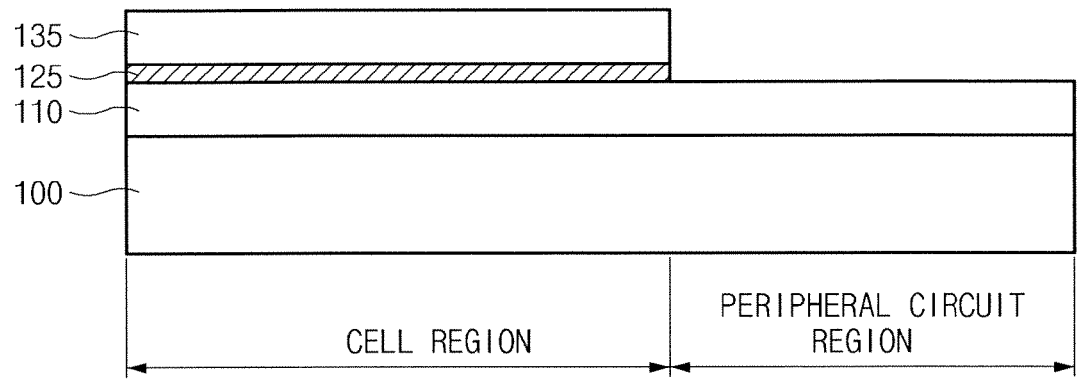

Referring to FIG. 2c, using the first photoresist pattern 135 as an etching mask, the first anti-reflective layer 120 is etched to form a first anti-reflective layer pattern 125. The first anti-reflective layer pattern 125 preferably remains only in the cell region.

Figure 2D:
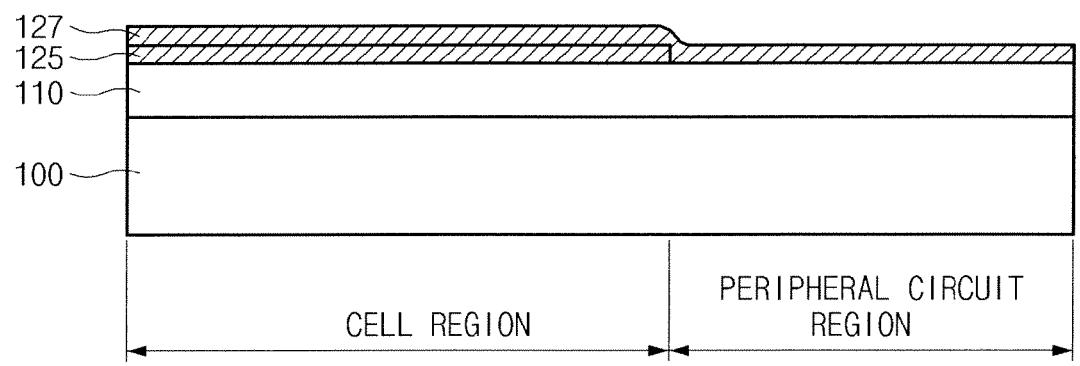

Referring to FIG. 2d, the first photoresist pattern 135 is removed, and a second anti-reflective layer 127 having a preset thickness is formed at the entire upper surface of the hard mask layer 110 including the first anti-reflective layer pattern 125. As illustrated, the first anti-reflective layer pattern 125 and the second anti-reflective layer 127 are laminated in the cell region, while only the second anti-reflective layer 127 is formed in the peripheral circuit region. The second anti-reflective layer 127 is preferably either an organic anti-reflective layer or an inorganic anti-reflective layer, and preferably has a thickness of 20 Å to 500 Å. Therefore, the net anti-reflective layer thickness in the cell region differs from the anti-reflective layer thickness in the peripheral circuit region by the thickness of the first anti-reflective layer pattern 125.

Figure 2E:
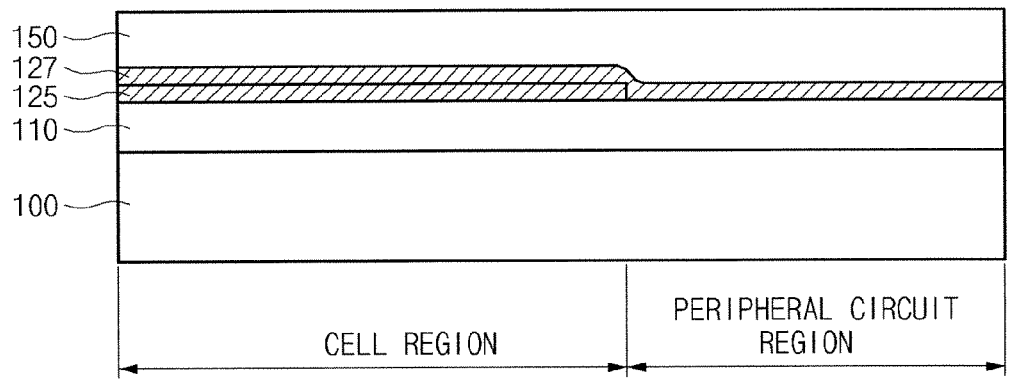
Figure 2F:
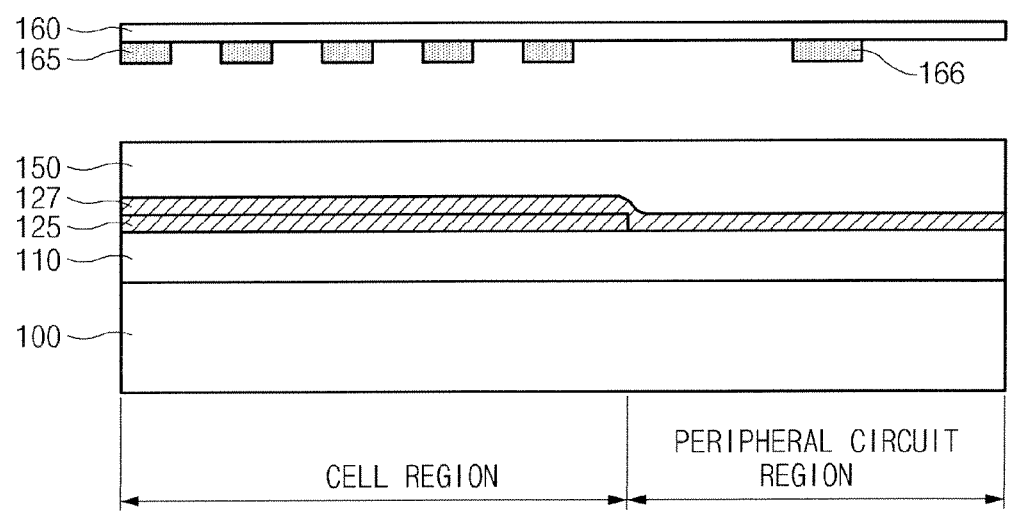

Referring to FIGS. 2e and 2f, a second photoresist 150 is formed at the entire upper surface of the second anti-reflective layer 127, and an exposure process is carried out using a second exposing mask 160 with a second light shielding pattern 165 and 166 in the form of a line/space pattern. The exposure process preferably is chosen from, but is not limited to, I-Line, KrF, ArF, and ArF immersion. In detail, the second light shielding pattern of the second exposing mask 160 includes of a dense pattern 165 formed in the corresponding cell region, and an isolation pattern 166 formed in the corresponding peripheral circuit region. In particular, the isolation pattern 166 of a corresponding peripheral circuit region has a relatively larger line width than the dense pattern 165 of a corresponding cell region.

Figure 2G:
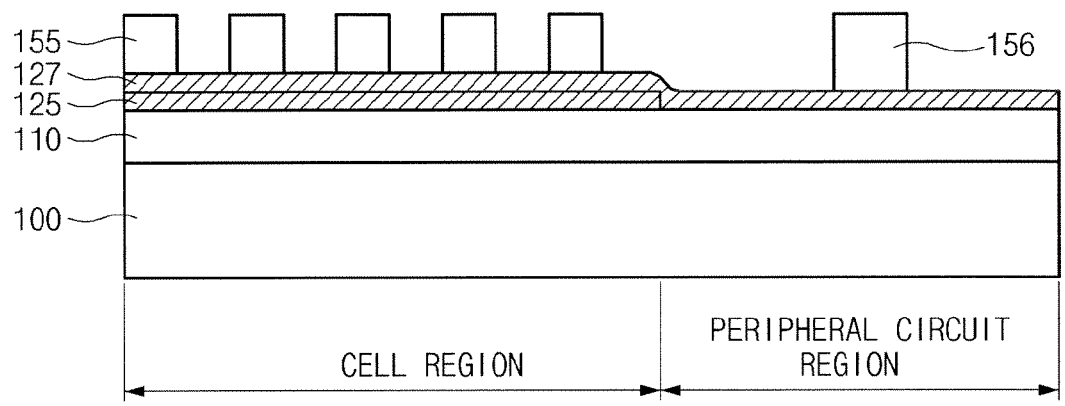

Referring to FIG. 2g, the second photoresist 150 is developed to form second photoresist line patterns 155 and 156. The second photoresist line pattern 155 of the peripheral circuit region has a relatively larger line width than the second photoresist line pattern 156 of the cell region.

Figure 2H:
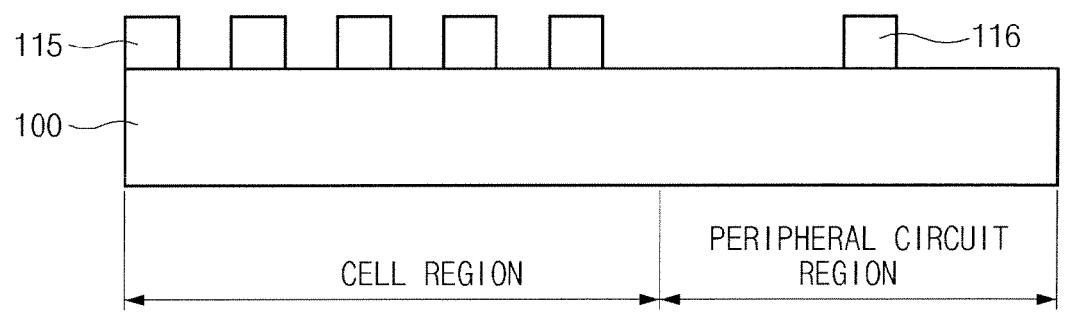

Referring to FIG. 2h, using the second photoresist line patterns 155 and 156 as an etching mask, the first anti-reflective layer pattern 125, the second anti-reflective layer 127, and the hard mask layer 150 are etched to form hard mask patterns 115 and 116 in the form of a line/space pattern. Here, a line width ratio between line and space is in a range of 1:1.5-100.

Since the second anti-reflective layer 127 in the peripheral circuit region is comparatively thinner than that of the cell region, it is over-etched while the first anti-reflective layer 125 and the second anti-reflective layer 127 formed in the cell region are etched. In this manner, the linewidth of the second anti-reflective layer 127 of the peripheral circuit region may be reduced.

Moreover, the second photoresist pattern 156 of the peripheral circuit region shrinks. Since the hard mask layer 110 is etched by using the shrunk second photoresist pattern 156 as an etching mask, the hard mask pattern 116 of the peripheral circuit region has a reduced line width.

Later, using the hard mask patterns 115 and 116 as an etching mask, the etching target layer 100 is etched to form an etching target layer pattern (not shown). Consequently, a fine pattern is formed in the peripheral circuit region.

While the invention has been described with respect to specific embodiments, various changes and modifications may be made without departing from the spirit and scope of the invention as defined in the following claims.

What is claimed is:

1. A method for manufacturing a semiconductor device, comprising the steps of:
    forming a hard mask layer and a first anti-reflective layer one by one over an etching target layer, the etching target layer including a dense pattern region and an isolation pattern region, wherein a pattern density of the dense pattern region is higher than the pattern density of the isolation pattern region;
    selectively etching the first anti-reflective layer to expose the hard mask layer in the isolation pattern region;
    forming a second anti-reflective layer over the first anti-reflective layer and the hard mask layer;
    forming a photoresist pattern on the second anti-reflective layer; and
    selectively etching the second anti-reflective layer, the first anti-reflective layer, and the hard mask layer, by using the photoresist pattern as an etching mask, thereby forming a hard mask pattern and over-etching the second anti-reflective layer in the isolation pattern region so that the hard mask pattern in the isolation pattern region is shrunk against the photoresist pattern in the isolation pattern region.

2. The method of claim 1, wherein the dense pattern region is a cell region, and the isolation pattern region is a peripheral circuit region.

3. The method of claim 1, wherein the first and second anti-reflective layers each comprise an organic anti-reflective layer.

4. The method of claim 1, wherein the first and second anti-reflective layers each comprise an inorganic anti-reflective layer.

5. The method of claim 1, wherein the second anti-reflective layer has a thickness range of 20 Å to 500 Å.

6. The method of claim 1, wherein the step of forming a photoresist pattern on the second anti-reflective layer comprises the steps of:
    forming a photoresist over the second anti-reflective layer; and
    exposing and developing the photoresist using an exposing mask comprising a light shielding pattern, thereby forming the photoresist pattern.

7. The method of claim 1, wherein the hard mask pattern includes a line/space pattern, and a line width ratio between line and space is in a range of 1:1.5-100.

8. The method of claim 5, wherein, on the exposing mask, line width of a pattern defined in the region having an isolation pattern is set to a value greater than line width of a pattern defined in the region having a dense pattern.

9. The method of claim 5, wherein the exposure process is carried out under I-line, KrF, ArF, or ArF Immersion exposure.

10. The method of claim 7, wherein the forming an anti-reflective layer comprises:
   forming a first anti-reflective layer over an etching target layer in both the cell region and the peripheral circuit region;
   etching the first anti-reflective layer in the peripheral circuit region to remain the first anti-reflective layer in the cell region; and
   forming a second anti-reflective layer in both the cell region and the peripheral circuit region.

11. A method for manufacturing a semiconductor device, comprising:
   providing an etching target layer over a semiconductor substrate including a cell region and a peripheral circuit region;
   forming an anti-reflective layer over the etching target layer, wherein the anti-reflective layer is a thicker layer in the cell region than in the peripheral circuit region; and
   patterning the anti-reflective layer using a mask in both the cell region and the peripheral circuit region so that the anti-reflective layer in the peripheral circuit region is excessively etched while the anti-reflective layer in the cell region is patterned, and a pattern width of the etch target layer in the peripheral circuit region is shrunk against the pattern width defined in the mask.

* * * * *